United States Patent
Jeong

(10) Patent No.: US 8,514,633 B2
(45) Date of Patent: Aug. 20, 2013

(54) METHOD FOR OPERATING SEMICONDUCTOR MEMORY DEVICE

(75) Inventor: Byoung Kwan Jeong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 314 days.

(21) Appl. No.: 12/982,654

(22) Filed: Dec. 30, 2010

(65) Prior Publication Data

US 2012/0008413 A1    Jan. 12, 2012

(30) Foreign Application Priority Data

Jul. 9, 2010   (KR) ........................ 10-2010-0066490

(51) Int. Cl.
*G11C 16/04*    (2006.01)

(52) U.S. Cl.
USPC ............. 365/185.24; 365/185.29; 365/185.12

(58) Field of Classification Search
USPC ............... 365/185.24, 185.29, 185.12, 185.3, 365/185.22
See application file for complete search history.

(56) References Cited

U.S. PATENT DOCUMENTS

| | | | | |
|---|---|---|---|---|
| 7,283,402 B2* | 10/2007 | Randolph et al. | ........ | 365/185.29 |
| 8,014,209 B2* | 9/2011 | Lutze et al. | ............. | 365/185.29 |
| 2009/0103360 A1 | 4/2009 | Kang et al. | | |
| 2009/0244976 A1 | 10/2009 | Kajimoto | | |

OTHER PUBLICATIONS

Notice of Preliminary Rejection issued from Korean Intellectual Property Office on Aug. 9, 2011.

* cited by examiner

*Primary Examiner* — David Lam
(74) *Attorney, Agent, or Firm* — IP & T Group LLP

(57) ABSTRACT

A method for operating a semiconductor memory device includes the steps of: erasing memory cells of a memory block to set the memory cells in a first erased state, programming a part of the memory cells of the memory block to convert them into a programmed state, raising threshold voltages of selected memory cells of the memory block and converting the selected memory cells from the programmed state to a second erased state, and reading data from the memory cells in the first erased state, the programmed state, and the second erased state, and outputting the data read from the memory cells in the first and second erased states with the same value.

20 Claims, 4 Drawing Sheets

METHOD FOR OPERATING SEMICONDUCTOR MEMORY DEVICE

CROSS-REFERENCE TO RELATED APPLICATIONS

The present application claims priority under 35 U.S.C 119(a) to Korean Application No. 10-2010-0066490, filed on Jul. 9, 2010, in the Korean Intellectual Property Office, which is incorporated by reference in its entirety.

BACKGROUND

1. Technical Field

Embodiments of the present invention relate generally to semiconductor memory devices.

2. Related Art

A flash memory device is a type of semiconductor memory and is organized by including a plurality of memory cell blocks. Each memory cell block (or memory block) is normally composed of a plurality of cell strings in which a plurality of memory cells are coupled in series, a plurality of bit lines, a plurality of word lines, drain selection transistors coupled between the cell strings and bit lines, and source selection transistors coupled between the cell strings and a common source line. A group of memory cells sharing a word line may constitute a page. Memory cells included in a unit memory block are commonly formed in a P-well of a semiconductor substrate. Further, a pass transistor circuit may be included to provide voltages to the memory block in the flash memory device. The pass transistor circuit may be composed from a drain selection high-voltage transistor, a source selection high-voltage transistor, and a cell selection high-voltage transistor.

In the flash memory device with such a configuration, in order to program data into memory cells, erasing is first carried out on all memory cells and then programming is performed only to selected memory cells. While programming is conducted on a page-by-page basis, erasing is performed on a memory block-by-memory block basis because all of the memory cells are sharing the P-well.

FIG. 1 graphically depicts threshold voltage distributions of memory cells resulting from programming and erasing operations of a general semiconductor memory device.

Referring to FIG. 1, erased memory cells having lower threshold voltages than a read voltage READ become programmed memory cells having higher threshold voltages than the read voltage READ as a result of a programming operation. On the other hand, programmed memory cells having higher threshold voltages than the read voltage READ become erased memory cells having lower threshold voltages than the read voltage READ as a result of an erasing operation.

However, even when only the selected pages should be erased, a flash memory device designed to erase data on a memory block-by-memory block basis may operate to erase the entire memory block, including the selected pages and unselected pages. As a result, the efficiency of data management in the flash memory device is reduced.

SUMMARY

Accordingly, exemplary embodiments of the present invention are directed to methods for operating semiconductor memory devices capable of converting programmed cells of a memory block containing a plurality of pages into an erased state by raising threshold voltages of the programmed cells included in a selected page above a predetermined voltage level, so that read data of memory cells having threshold voltages that are higher than the predetermined voltage level has a data value indicating the memory cells are in the erased state.

In an exemplary embodiment, a method for operating a semiconductor memory device includes programming memory cells of a selected memory block, and shifting threshold voltages of selected memory cells from among the programmed memory cells above a predetermined voltage level to convert the selected memory cells into a virtually erased state, wherein data from the memory cells in the virtually erased state may be output as erased data values during a reading operation.

In another exemplary embodiment, a method for operating a semiconductor memory device includes erasing memory cells of a memory block to set the memory cells in a first erased state, programming a part of the memory cells of the memory block to convert them into a programmed state, and raising threshold voltages of selected memory cells, which are selected from among the memory cells in the programmed state, to convert the selected memory cells into a second erased state, wherein memory cells in the second erased state have the same read data value as memory cells in the first erased state.

According to another exemplary embodiment, a method for operating a semiconductor memory device includes erasing memory cells of a memory block to set the memory cells in a first erased state, programming a part of the memory cells of the memory block to convert them into a programmed state, raising threshold voltages of selected memory cells of the memory block and converting the selected memory cells from the programmed state to a second erased state, and reading data from the memory cells in the first erased state, the programmed state, and the second erased state, and outputting the data read from the memory cells in the first and second erased states with the same value.

According to another exemplary embodiment, a method for operating a semiconductor memory device includes erasing memory cells of a memory block to set the memory cells in a first erased state, programming a part of memory cells of the memory block to convert them into a first programmed state, and raising threshold voltages of selected memory cells, which are selected from among the memory cells in the first programmed state to convert the selected memory cells to a second programmed state.

The method may further include storing information of the second programmed state in a flag cell of a page containing the selected memory cells after converting the selected memory cells to the second programmed state.

A further understanding of the nature and advantages of the present invention herein may be realized by reference to the remaining portions of the specification and the attached drawings.

BRIEF DESCRIPTION OF THE DRAWINGS

The present invention is illustrated by way of example, and not by way of limitation, in the figures of the accompanying drawings, in which like reference numbers refer to similar elements, the accompanying drawings briefly described as follows.

DESCRIPTION OF EMBODIMENTS

Hereinafter, various exemplary embodiments will be described more fully with reference to the accompanying drawings in which some exemplary embodiments are shown. However, specific structural and functional details disclosed herein are merely representative for purposes of describing exemplary embodiments of the present invention.

The terminology used herein is for the purpose of describing particular embodiments only and is not intended to limit all exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items. Also it should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe exemplary embodiments, various aspects will be hereinafter described in detail with reference to the attached drawings.

Figure 1:
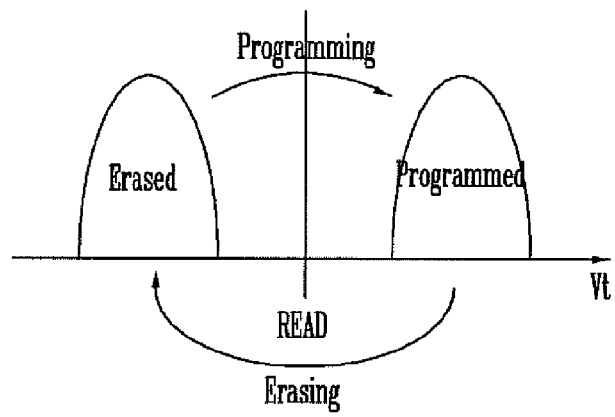
FIG. 1 is a diagram showing threshold voltage distributions of memory cells resulting from programming and erasing operations of a general semiconductor memory device.
Figure 2:
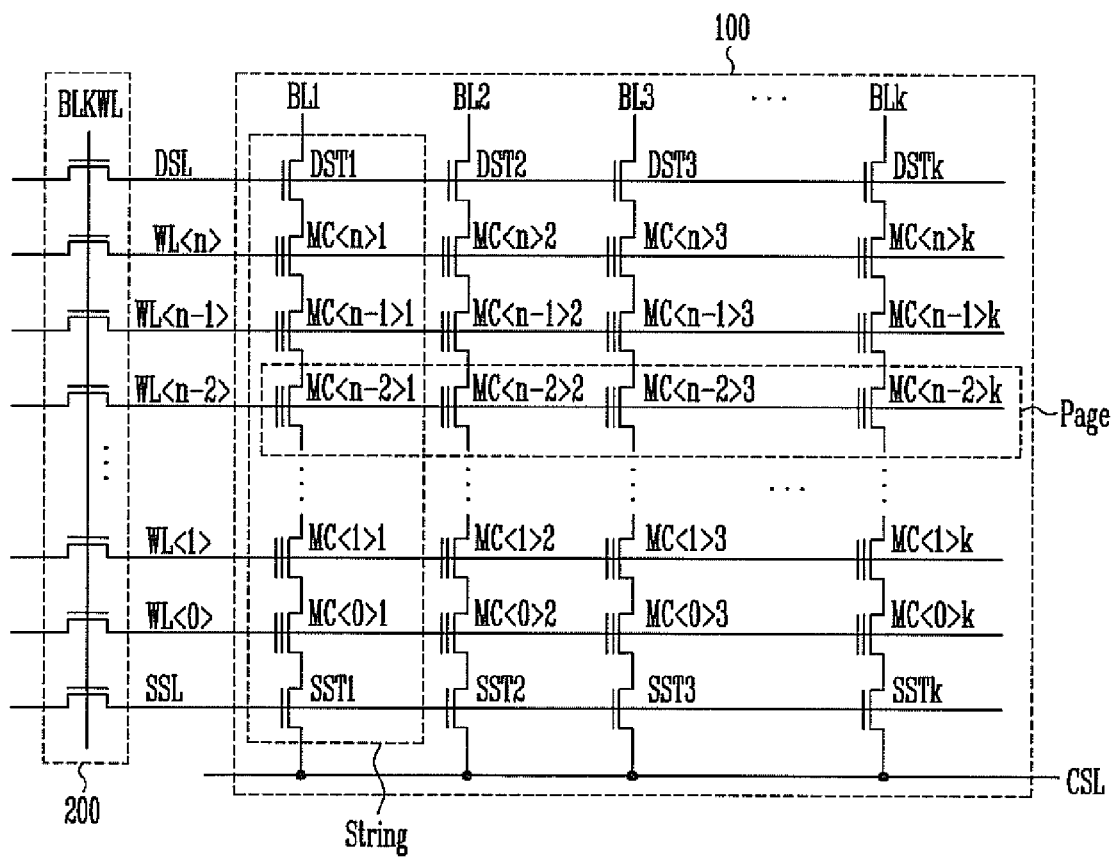
FIG. 2 is a circuit diagram illustrating a memory block and a pass selector of a semiconductor memory device.

Referring to FIG. 2, a semiconductor memory device includes a memory block 100 and a pass selector 200.

The memory block 100 is composed of a plurality of strings. Each string, for example, is formed of a drain selection transistor DST, a plurality of memory cells MC<n>-MC<0>, and a source selection transistor SST, all of which are serially coupled between a corresponding bit line BL and a common source line CSL. In the memory block 100, a group of memory cells sharing the same word line is defined as 'page'. For instance, the group of the memory cells MC<n−2>1-MC<n−2>k having gates commonly coupled to the word line WL<n−2> can be defined as one page.

The pass selector 200 is composed of a plurality of high voltage transistors. These high voltage transistors function to transfer operation voltages to a drain selection line DSL, a plurality of word lines WL<0>-WL<n>, and a source selection line SSL of the memory block 100 in response to a block selection signal BLKWL.

Figure 3:
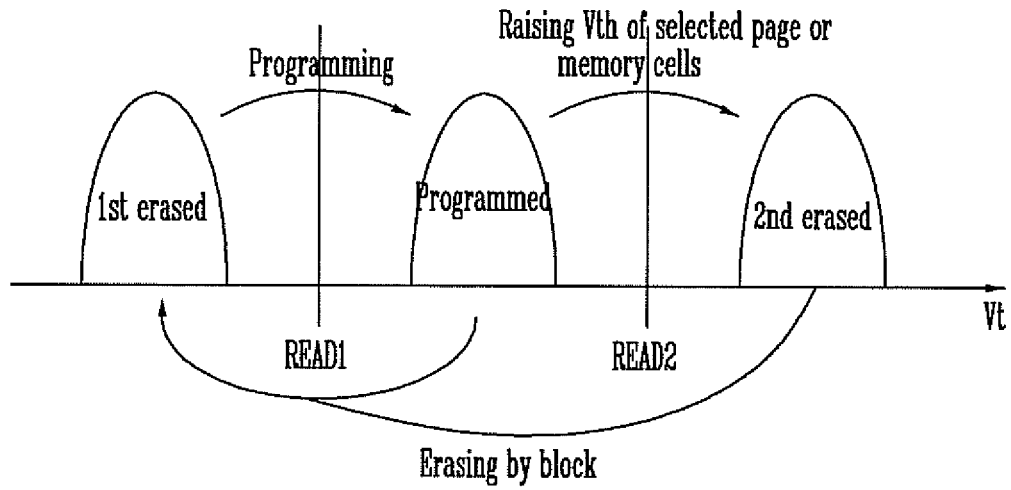
FIG. 3 is a diagram showing threshold voltage distributions of memory cells resulting from an operating method of a semiconductor memory device according to an exemplary embodiment of the present invention.

FIG. 3 graphically depicts threshold voltage distributions of memory cells resulting from an operating method of a semiconductor memory device according to an exemplary embodiment of the present invention.

Figure 4:
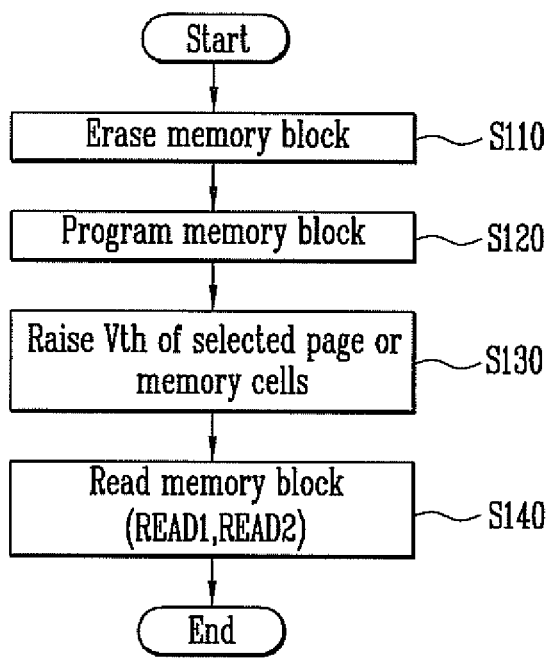
FIG. 4 is a flow chart showing an operating method of a semiconductor memory device according to an exemplary embodiment of the present invention.

FIG. 4 shows a sequence of steps of an operating method of a semiconductor memory device according to an exemplary embodiment of the present invention.

Now, referring to FIGS. 2 through 4, the steps of a method for operating the semiconductor memory device according to an exemplary embodiment of the present invention are described.

1) Memory Block Erasing (S110)

The memory block 100 is erased by applying an erasing voltage, having a relatively high voltage level, to a well region of a semiconductor substrate in which the memory block 100 is formed. Thus, all memory cells included in the memory block 100 are set with a threshold voltage distribution corresponding to a first erased state. In this case, where the memory cells are in the first erased state, a single-bit memory cell has an erased data value of "1" while a 2-bit multi-level cell has an erased data value of "11".

2) Memory Block Programming (S120)

Programming is carried out by applying a program voltage to memory cells of the memory block 100. Programming may be conducted on a page-by-page basis (i.e., one page at a time may be programmed). For example, after applying a program voltage to the word line WL<0>, the memory cells MC<0>1-MC<0>k of the same page are programmed by controlling voltage levels of the bit lines BL1-BLk according to data values to be programmed. After one page is programmed, the next page is programmed. For instance, after programming memory cells MC<0>1-MC<0>k corresponding to the word line WL<0>, the program voltage is applied to the word line WL<1>, so that the memory cells MC<1>1-MC<1>k of the next page can be programmed by controlling voltage levels of the bit lines BL1-BLk according to data values to be programmed. Programmed cells are set to have threshold voltages above a first read voltage READ1. While programming a selected page, word lines corresponding to the remaining unselected pages are supplied with a pass voltage, inhibiting the memory cells of the unselected pages from being programmed.

As stated, pages of the memory block 100 are programmed in sequence on a page-by-page basis.

After programming, the memory block 100 is partly or wholly changed into a programmed state from the first erased state. For the memory cells having the threshold voltages of the programmed state, single-bit memory cells have programmed data values of "0", while 2-bit multi-level cells have programmed data values of "00", "01", and "10".

3) Raising Threshold Voltages of Selected Page or Cells (S130)

After programming, threshold voltages of a selected page or selected cells in the programmed state are raised to convert them into a second erased state. More specifically, to convert a selected page or selected cells from the programmed state into a second erased state, having a data value that is the same as the first erased state, the threshold voltages of the selected page or cells are raised above a predetermined voltage level.

The second erased state can be regarded as a virtually erased state, which has a threshold voltage distribution that is read as erased data in a subsequent reading operation even though the threshold voltage distribution is not in a negative voltage region.

For example, after completing the memory block programming S120, threshold voltages of programmed memory cells, such as memory cells MC<1>2 and MC<1>k, which belong to the selected page that has been programmed, are raised to those of the second erased state. That is, the threshold voltages of the memory cells MC<1>2 and MC<1>k are raised above a second read voltage READ2 higher than the first read voltage READ1 by applying a high voltage to the word line WL1 and applying an operation voltage of 0V to the bit lines BL2 and BLk coupled to the memory cells MC<1>2 and MC<1>k, respectively. While raising the threshold voltage of selected memory cells (e.g., MC<1>2 and MC<1>k), the remaining bit lines (e.g., BL1, BL3, etc), excluding bit lines corresponding to the selected memory cells (e.g., BL2 and BLk) are supplied with a power voltage to inhibit threshold voltages of the remaining memory cells (e.g., MC<1>1, MC<1>3, etc.) from being raised. The second read voltage READ2 may be set to a level higher than the highest threshold voltage of a memory cell in the programmed state.

This process S130 for raising the threshold voltages of the selected page or cells to the second erased state from the programmed state may be carried out between programming steps of the memory block 100, i.e., between programming the different pages of the memory block 100.

4) Memory Block Read (S140)

Reading is performed to detect programmed data from the memory block 100. Reading is sequentially carried out through first and second reading operations. The first reading operation is designed to read data from the memory cells of the memory block 100 by distinguishing memory cells in the first erased state from memory cells in the programmed state according to whether threshold voltages of the memory cells of the memory block 100 are equal to, lower than, or higher than the first read voltage READ1. The second reading operation is designed to read data from the memory cells by distinguishing memory cells in the programmed state from memory cells in the second erased state (i.e., the virtually erased state) according to whether threshold voltages of the memory cells determined to be programmed cells as a result of the first reading operation are equal to, lower than, or higher than the second read voltage READ2.

While reading, the memory cells having threshold voltages of the first and second erased states are controlled to output the same data value. That is, reading the memory cells having threshold voltages corresponding to the first erased state outputs an erased data value, and reading the memory cells having threshold voltages corresponding to the second erased state outputs the same erased data value.

For example, given a semiconductor memory device with single level cells, if a read data value of memory cells in the first erased state is "1" and a read data value of programmed memory cells is "0", then a read data value of memory cells in the second erased state is modified and output as "1". For a semiconductor memory device with multi-level cells, if a read data value of memory cells in the first erased state is "11" and read data values of programmed memory cells are "00", "01" and "10", then a read data value of memory cells in the second erased state is modified and output as "11".

Accordingly, programmed data may be modified to erased data for pages or memory cells in the memory block 100 by raising threshold voltages of programmed memory cells to convert them to the second erased state and by reading memory cells, which have threshold voltages of the second erased state, to output the same read data value as memory cells having threshold voltages of the first erased state.

Figure 5A:
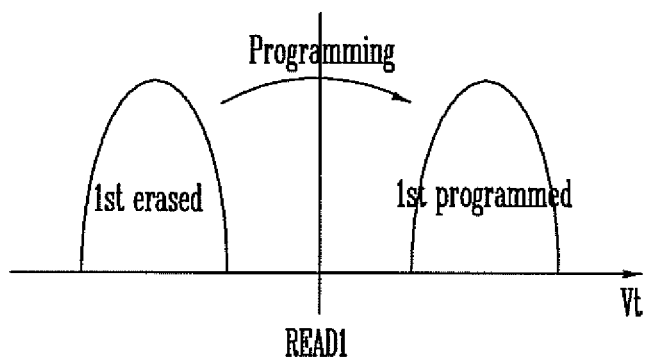
FIGS. 5A and 5B are diagrams showing threshold voltage distributions of memory cells resulting from an operating method of a semiconductor memory device according to another exemplary embodiment of the present invention.
Figure 5B:
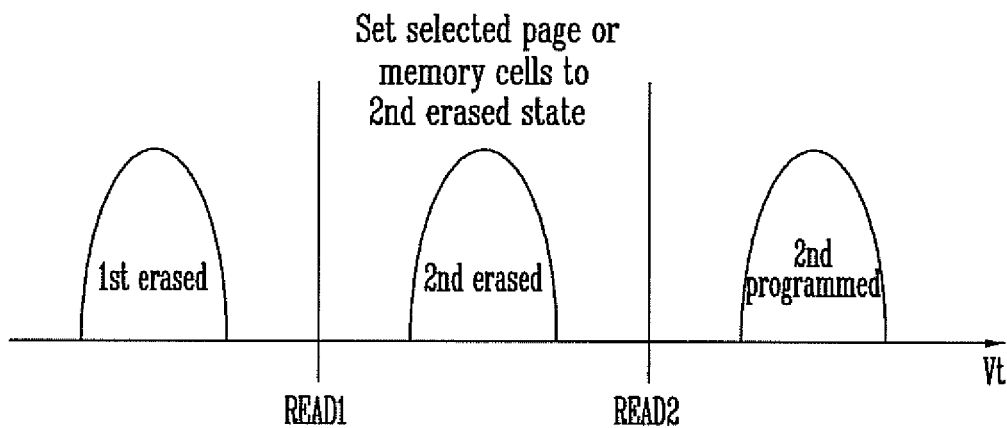

FIGS. 5A and 5B depict threshold voltage distributions of memory cells resulting from an operating method of a semiconductor memory device according to another exemplary embodiment of the present invention.

Figure 6:
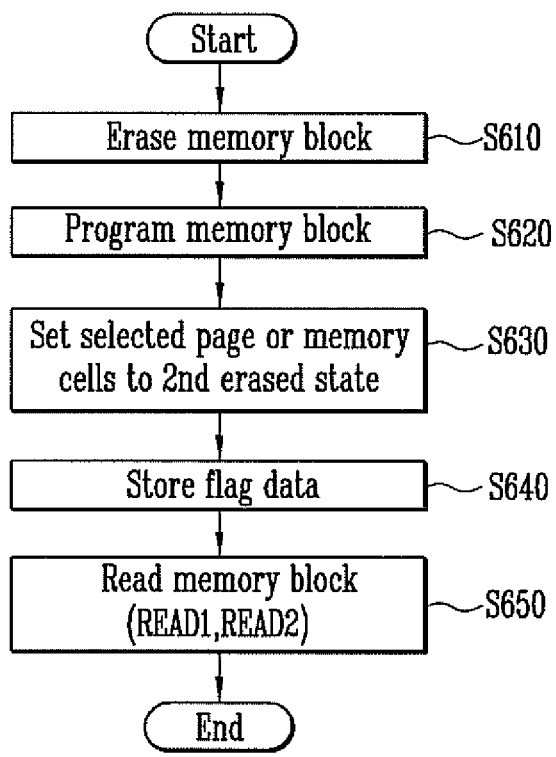
FIG. 6 is a flow chart showing an operating method of a semiconductor memory device according to another exemplary embodiment of the present invention.

FIG. 6 shows a sequence of steps of an operating method of a semiconductor memory device according to another exemplary embodiment of the present invention.

Now, referring to FIGS. 2, 5A, 5B, and 6, the steps of an operation method in accordance with another exemplary embodiment of the present invention are described.

1) Memory Block Erasing (S610)

The memory block 100 is erased by applying an erasing voltage, having a relatively high voltage level, to a well region of a semiconductor substrate in which the memory block 100 is formed. Thus, all memory cells included in the memory block 100 are set with a threshold voltage distribution corresponding to the first erased state. In this case, where the memory cells are in the first erased state, a single-bit memory cell has an erased data value of "1" while a 2-bit multi-level cell has an erased data value of "11".

2) Memory Block Programming (S620)

Programming is carried out by applying a program voltage to memory cells of the memory block 100. Programming may be conducted on a page-by-page basis (i.e., one page at a time may be programmed). For example, after applying a program voltage to the word line WL<0>, the memory cells MC<0>1-MC<0>k of the same page are programmed by controlling voltage levels of the bit lines BL1-BLk according to data values to be programmed. After one page is programmed, the next page is programmed. For instance, after programming memory cells MC<0>1-MC<0>k corresponding to the word line WL<0>, the program voltage is applied to the word line WL<1>, so that the memory cells MC<1>1-<1>k of the next page can be programmed by controlling voltage levels of the bit lines BL1-BLk according to data values to be programmed. First programmed cells are set to have threshold voltages above the first read voltage READ1. While programming a selected page, word lines corresponding to the remaining unselected pages are supplied with a pass voltage, inhibiting the memory cells of the unselected pages from being programmed.

As described, pages of the memory block 100 are programmed in sequence on a page-by-page basis.

After programming, the memory block 100 is partly or wholly changed into a first programmed state from the first erased state.

For the memory cells having the threshold voltages of the first programmed state, single-bit memory cells have programmed data values of "0", while 2-bit multi-level cells have programmed data values of "00", "01", and "10".

3) Set Selected Page or Cells in 1st Programmed State to 2nd Erased State (S630)

After programming, a selected page or selected cells in the first programmed state are converted into a second erased state. More specifically, the threshold voltages of the remaining unselected memory cells in the first programmed state are raised to convert the unselected memory cells in the first programmed state to memory cells in a second programmed state. As a result, the first programmed memory cells, which have do not have raised threshold voltages, are set to the second erased state. Here, the second erased state can be regarded as a virtually erased state, which has a threshold voltage distribution that is read as erased data in a subsequent reading operation even though the threshold voltage distribution is not in a negative voltage region.

For example, after completing the memory block programming S620, to set the memory cells MC<1>2 and MC<1>k of the first programmed state to the second erased state, the threshold voltages of the remaining memory cells MC<1>1, MC<1>3, etc. are raised above the second read voltage READ2 higher than the first read voltage READ1 by applying a program voltage to the word line WL<1> and applying an operation voltage of 0V to the bit lines BL1, BL3, etc. coupled to the memory cells MC<1>1, MC<1>3, etc., respectively.

This process S630 for setting the selected page or cells to the second erased state from the first programmed state may be carried out between programming steps of the memory block 100, i.e., between programming the different pages of the memory block 100.

4) Flag Data Storing (S640)

Flag data is stored in a flag cell, which is assigned to the selected page or cells set to the second erased state from the first programmed state in the step S630, indicating the state conversion of the selected page or cells for which the flag cell is assigned.

5) Memory Block Read (S650)

Reading is performed to detect programmed data from the memory block 100. First, the flag data is sensed from the flag cell of a page to be read to determine whether or not the page to be read has experienced the step S630. If the page to be read has experienced the step S630, then the second voltage READ2 is used for reading the page. If the page to be read has not experienced the step S630, then the first reading voltage READ1 is used for reading the page. Thus, the first or second read voltage READ1 or READ2 is supplied to read the selected page.

While reading, the memory cells having threshold voltages of the first and second erased states are controlled to output the same data value.

Accordingly, programmed data may be modified to erased data for pages or memory cells in the memory block 100 by raising threshold voltages of unselected memory cells among memory cells in the first programmed state to convert them to the second programmed state thereby setting the selected memory cells to the second erased state.

The foregoing is illustrative of exemplary embodiments and is not to be construed as limiting thereof. Although a few exemplary embodiments have been described, those skilled in the art will readily appreciate that many modifications are possible in light of the exemplary embodiments without materially departing from the novel teachings and advantages. Accordingly, all such modifications are intended to be included within the scope of this invention as defined in the claims.

What is claimed is:

1. A method for operating a semiconductor memory device, the method comprising:
    programming memory cells of a selected memory block; and
    raising threshold voltages of selected memory cells, above a predetermined voltage level to convert the selected memory cells into a virtually erased state,
    wherein data from the memory cells in the virtually erased state are output as erased data values during a reading operation.

2. The method of claim 1, further comprising erasing the selected memory block before programming the memory cells.

3. The method of claim 1, wherein raising the threshold voltages of the selected memory cells above the predetermined voltage level comprises applying a relatively high voltage to a word line of a page containing the selected cells while applying an operation voltage to a bit line coupled to the selected cells.

4. The method of claim 3, wherein raising the threshold voltages of the selected memory cells above the predetermined voltage level further comprises applying a power voltage to bit lines, which are coupled to the remaining unselected memory cells within the page, to inhibit threshold voltages of the remaining unselected memory cells from rising.

5. A method for operating a semiconductor memory device, the method comprising:
    erasing memory cells of a memory block to set the memory cells in a first erased state;
    programming a part of the memory cells of the memory block to convert them into a programmed state; and
    raising threshold voltages of selected memory cells, which are selected from among the memory cells in the programmed state, to convert the selected memory cells into a second erased state,
    wherein memory cells in the second erased state have the same read data value as memory cells in the first erased state.

6. The method of claim 5, further comprising reading data programmed in the memory block, after raising threshold voltages of the selected memory cells,
    wherein the reading comprises a first reading operation using a first read voltage and a second reading operation using a second read voltage.

7. The method of claim 6, wherein the first reading operation reads data by determining whether a memory cell is in the first erased state or the programmed state, and the second reading operation reads data by determining whether a memory cell is in the programmed state or the second erased state.

8. The method of claim 5, wherein raising threshold voltages of the selected memory cells comprises applying a relatively high voltage to a word line of a page containing the selected memory cells while applying an operation voltage to a bit line coupled to the selected memory cells.

9. The method of claim 8, wherein raising threshold voltages of the selected memory cells further comprises applying a power voltage to bit lines coupled with the remaining unselected memory cells of the page to inhibit threshold voltages of the remaining unselected memory cells from rising.

10. A method for operating a semiconductor memory device, the method comprising:
    erasing memory cells of a memory block to set the memory cells in a first erased state;
    programming a part of the memory cells of the memory block to convert them into a programmed state;
    raising threshold voltages of selected memory cells of the memory block and converting the selected memory cells from the programmed state to a second erased state; and
    reading data from the memory cells in the first erased state, the programmed state, and the second erased state, and outputting the data read from the memory cells in the first and second erased states with the same value.

11. The method of claim 10, wherein the reading progresses through a sequence of a first reading operation using a first read voltage and a second reading operation using a second read voltage.

12. The method of claim 11, wherein the first reading operation reads data from memory cells in the first erased state and the programmed state and the second reading operation reads data from memory cells in the programmed state and the second erased state.

13. The method of claim 10, wherein converting the selected memory cells into the second erased state comprises applying a high voltage to a word line of a page containing the selected memory cells while applying an operation voltage, which is lower than the high voltage, to a bit line coupled to the selected memory cells.

14. A method for operating a semiconductor memory device, the method comprising:
    erasing memory cells of a memory block to set the memory cells in a first erased state;
    programming a part of memory cells of the memory block to convert them into a first programmed state; and
    raising threshold voltages of selected memory cells, which are selected from among the memory cells in the first programmed state to convert the selected memory cells to a second programmed state.

15. The method of claim 14, further comprising storing information of the second programmed state in a flag cell of a page containing the selected memory cells after converting the selected memory cells to the second programmed state.

16. The method of claim 15, wherein a reading operation is conducted to read programmed data from the memory block after storing the information of the second programmed state in the flag cell, wherein a read voltage used for the reading operation is set according to the information of the second programmed state.

17. The method of claim 16, wherein the reading operation is conducted with a first read voltage if the flag cell of a selected page stores the information of the second programmed state indicating that memory cells of the selected page have not been converted into the second programmed state.

18. The method of claim 17, wherein the reading operation is conducted with a second read voltage, which is higher than the first read voltage, if the flag cell of the selected page stores the information of the second programmed state indicating that memory cells of the selected page have been converted into the second programmed state.

19. The method of claim 14, wherein the remaining unselected memory cells from among the memory cells in the first programmed state are converted into a second erased state.

20. The method of claim 19, wherein read data outputted from reading the memory cells in the first and second erased states have the same data value.

* * * * *